US008258697B2

(12) United States Patent
Muranaka et al.

(10) Patent No.: US 8,258,697 B2
(45) Date of Patent: Sep. 4, 2012

(54) LIGHT EMITTING DEVICE (75) Inventors: Tetsuya Muranaka, Fukuoka-ken (JP);
Toshihiro Kuroki, Fukuoka-ken (JP);
Toshiaki Hosoya, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 35 days.

(21) Appl. No.: 12/969,743

(22) Filed: Dec. 16, 2010

(65) Prior Publication Data
US 2011/0291541 A1 Dec. 1, 2011

(30) Foreign Application Priority Data

Jun. 1, 2010 (JP) ................................ 2010-126207

(51) Int. Cl.
*H01L 33/62* (2010.01)
*H01L 33/64* (2010.01)
*H01L 33/52* (2010.01)

(52) U.S. Cl. ........ 313/512; 313/499; 257/666; 257/676; 257/675; 257/99; 257/100

(58) Field of Classification Search .......... 313/498–512; 257/88–100, 666–677; 438/123–124
See application file for complete search history.

(56) References Cited

U.S. PATENT DOCUMENTS

| | | | | |
|---|---|---|---|---|
| 3,914,786 A | * | 10/1975 | Grossi .............................. | 257/98 |
| 4,255,688 A | * | 3/1981 | Nagasawa ..................... | 313/499 |
| 7,858,993 B2 | * | 12/2010 | Kong et al. ...................... | 257/81 |
| 7,932,525 B2 | * | 4/2011 | Osamu ............................. | 257/89 |
| 8,067,779 B2 | * | 11/2011 | Muranaka et al. .............. | 257/98 |
| 2006/0054912 A1 | * | 3/2006 | Murakami et al. .............. | 257/99 |
| 2008/0128724 A1 | * | 6/2008 | Isobe et al. ...................... | 257/98 |
| 2010/0171139 A1 | | 7/2010 | Muranaka et al. | |

FOREIGN PATENT DOCUMENTS

JP 06204569 A * 7/1994
JP 2007180320 A * 7/2007

* cited by examiner

*Primary Examiner* — Mariceli Santiago

(74) *Attorney, Agent, or Firm* — Turocy & Watson, LLP (57) ABSTRACT

According to one embodiment, a light emitting device includes a first lead, a light emitting element, a second lead and a molded body. The first lead includes a die pad portion having a major surface and a recess provided in the major surface, a bent portion bent toward above the major surface, and a thermally conductive portion extending outward from the die pad portion. The first lead is provided with a slit at an end of a fold. The light emitting element is bonded to a bottom surface of the recess. The second lead with one end portion is opposed to one end portion of the first lead. The molded body covers the light emitting element, the bent portion, the die pad portion, the thermally conductive portion, and the one end portion of the second lead, penetrates through the slit, and is made of a resin.

20 Claims, 8 Drawing Sheets

LIGHT EMITTING DEVICE

CROSS-REFERENCE TO RELATED APPLICATIONS

This application is based upon and claims the benefit of priority from the prior Japanese Patent Application No. 2010-126207, filed on Jun. 1, 2010; the entire contents of which are incorporated herein by reference.

FIELD

Embodiments described herein relate generally to a light emitting device.

BACKGROUND

Applications such as vehicle-mounted exterior lights and traffic lights require light emitting devices capable of producing high optical output by high-current operation.

One of such light emitting devices is known as a power LED (light emitting diode). Inside the package of a power LED, emission light from the light emitting element needs to be reflected upward. If a recess is provided in the lead frame, the emission light from the light emitting element bonded to the bottom surface of the recess can be reflected upward by the side surface of the recess.

However, in the case where the side surface of the recess is used as a reflector, it is difficult to extract the light in the direction of a large angle from the optical axis of the light emitting element. Thus, it is not easy to sufficiently increase the optical output.

DETAILED DESCRIPTION

In general, according to one embodiment, a light emitting device includes a first lead, a light emitting element, a second lead and a molded body. The first lead includes a die pad portion having a major surface and a recess provided in the major surface, a bent portion bent toward above the major surface, and a thermally conductive portion extending outward from the die pad portion. The first lead is provided with a slit at an end of a fold between the bent portion and the major surface. The light emitting element is bonded to a bottom surface of the recess. The second lead with one end portion is opposed to one end portion of the first lead. The molded body covers the light emitting element, the bent portion, the die pad portion, the thermally conductive portion, and the one end portion of the second lead, penetrates through the slit, and is made of a resin. Another end portion of the first lead and another end portion of the second lead are projected from the molded body.

Embodiments of the invention will now be described with reference to the drawings.

Figure 1A:
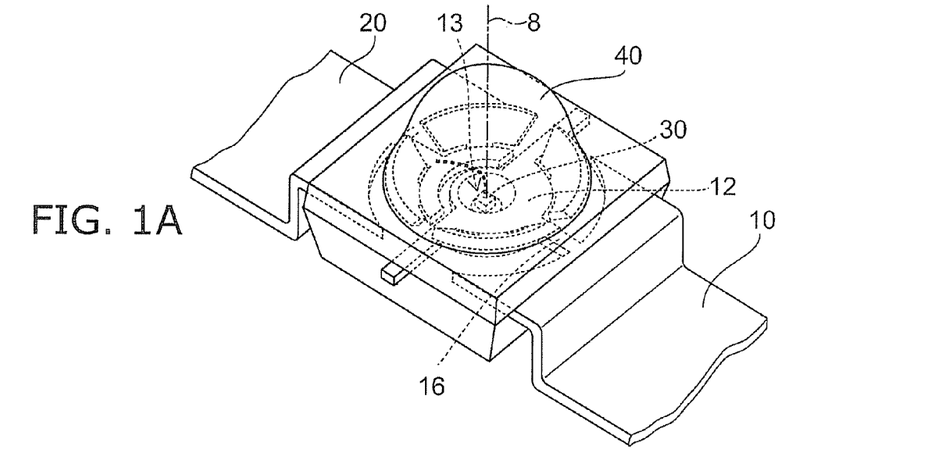
FIG. 1A is a schematic perspective view of a light emitting device according to a first embodiment of the invention.
Figure 1B:
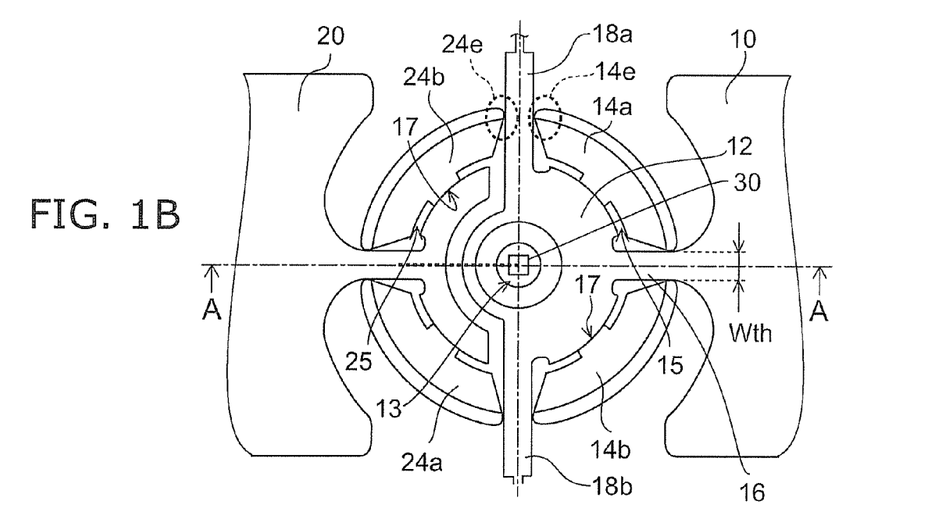
FIG. 1B is a schematic plan view thereof.
Figure 1C:
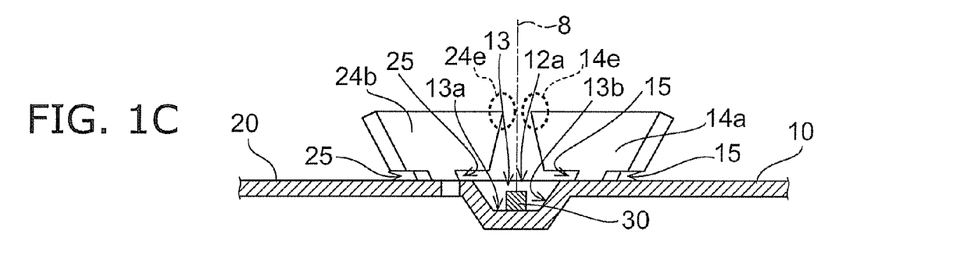
FIG. 1C is a schematic sectional view taken along line A-A.

FIG. 1A is a schematic perspective view of a light emitting device according to a first embodiment of the invention. FIG. 1B is a schematic plan view of a lead frame before the molding process. FIG. 1C is a schematic sectional view taken along line A-A.

The light emitting device includes a first lead 10, a second lead 20, a light emitting element 30, and a molded body 40 made of a transparent resin.

The first lead 10 includes a die pad portion 12 provided on one end portion side, a bent portion 14 bent toward above the major surface 12a of the die pad portion 12, and a thermally conductive portion 16 connected to the die pad portion 12, provided on the other end portion side, and having width Wth.

The die pad portion 12 includes a recess 13 in the major surface 12a thereof. The recess 13 has a bottom surface 13a and an inclined side surface 13b. To the bottom surface 13a, the light emitting element 30 is bonded with an adhesive or solder material.

Slits 15 are cut respectively at both ends of the fold 17 bordering between the bent portion 14 and the major surface 12a of the die pad portion 12. A slit may be cut at an end of the fold 17. The number of bent portions 14 may be one. However, in FIGS. 1A to 1C, the bent portion 14 of the first lead includes two bent portions 14a, 14b. The thermally conductive portion 16 extends between the bent portions 14a and 14b from the die pad portion 12.

One end portion of the second lead 20 is opposed to one end portion of the first lead 10. The second lead 20 includes a bent portion 24a and a bent portion 24b. Slits 25 are cut respectively at both ends of the fold 17 bordering between the bent portion 24 and the major surface of the second lead 20. The one end portion of the second lead 20 is connected to one of the electrodes of the light emitting element 30 by a bonding wire.

The molded body 40 made of a transparent resin covers the light emitting element 30, the bent portions 14, 24, the die pad portion 12, the thermally conductive portion 16, and a suspension pin 18, and penetrates through the slits 15, 25. The term "transparent resin" used herein refers to a resin translucent to light emitted from the light emitting element 30. The transmittance for light emitted from the light emitting element 30 does not necessarily need to be 100%. The "transparent resin" includes any resin having nonzero transmittance for light emitted from the light emitting element 30.

The side surface 13b of the recess 13 acts as a first reflector to reflect upward the emission light, thereby increasing the optical output. Furthermore, the bent portions 14, 24 act as a second reflector to reflect upward the light having a large angle from the optical axis 8 of the light emitting element 30, so that the optical output can be further increased. Here, as shown in FIG. 1C, the corner portions 14e, 24e of the bent portions 14, 24 narrow the gap above the thermally conductive portion 16 and one end portion of the second lead 20, respectively, so that light leakage can be reduced. Furthermore, a lens surface can be formed at the upper surface of the molded body 40. Then, the emission light and the reflection light from the first and second reflectors can be collected.

The slits 15, 25 are provided at both ends of the fold 17 where the bent portions 14, 24 are bent from the die pad portion 12. The slits 15, 25 thus provided facilitate press working even for large bent portions 14, 24, and facilitate forming a curved surface as desired. The slits 15, 25 are provided along the direction of the fold 17 between the major surface of the first and second leads 10, 20 and the bent portions 14, 24. Hence, the amount of light leakage of the emission light of the light emitting element 30 can be reduced. Preferably, the depth of the recess 13 is made larger than the height of the light emitting element 30, because this can reduce the light leakage.

The slits 15, 25, the bent portions, the through hole formed after bending the bent portions, and the suspension pin 18 can increase the adhesion strength between the sealing resin 40 and the lead frame. This anchor effect reduces the stress occurring due to the difference in thermal expansion coefficient between the lead frame and the sealing resin 40. This can suppress detachment at interfaces and cracking in the sealing resin. Consequently, the electrical and optical characteristics of the light emitting device can be maintained more stably.

Figure 2A:
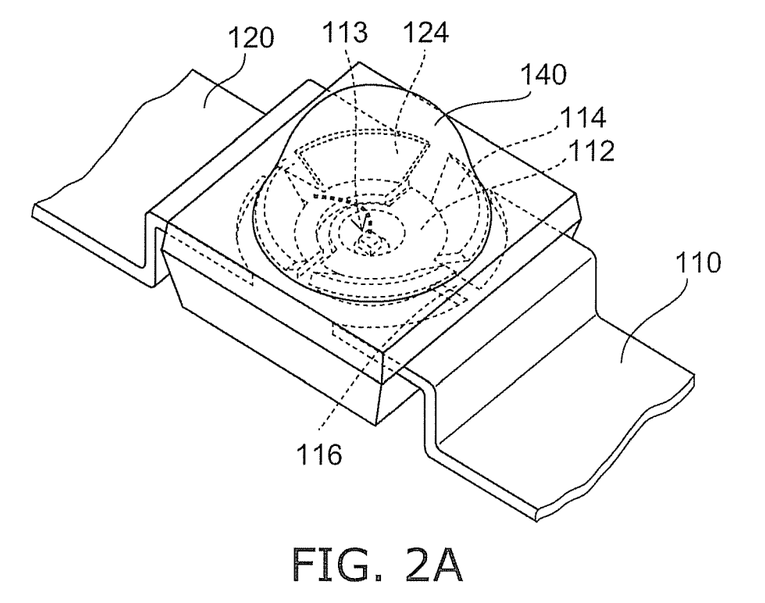
FIG. 2A is a schematic perspective view of a light emitting device according to a comparative example.
Figure 2B:
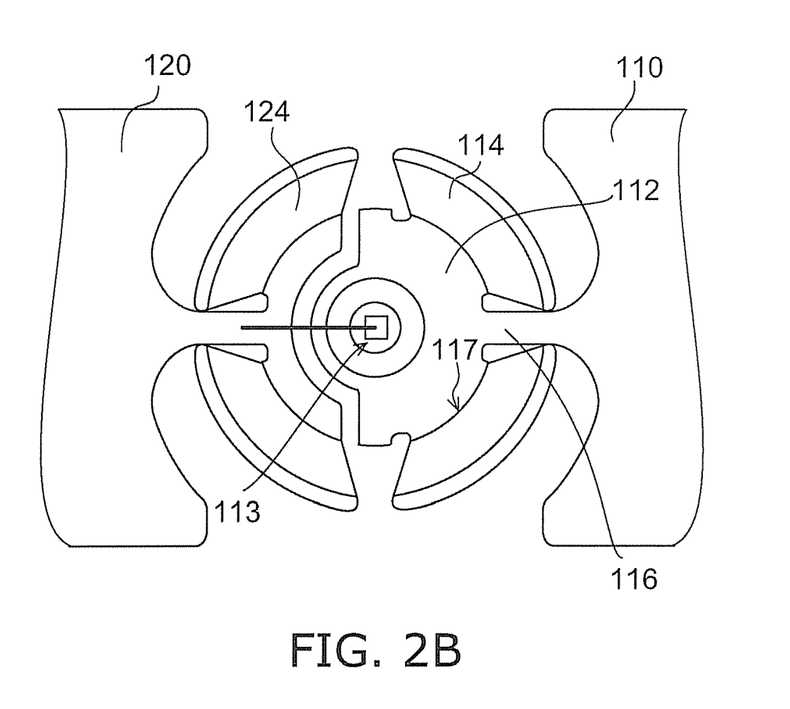
FIG. 2B is a schematic plan view.

FIG. 2A is a schematic perspective view of a light emitting device according to a comparative example. FIG. 2B is a schematic plan view of a lead frame before the molding process.

No slit is provided at the bent portion 114 of the first lead 110 and the bent portion 124 of the second lead 120. Hence, it is difficult to form a reflection surface having a desired shape in large bent portions 114, 124. Thus, it is not easy to increase the output power. Furthermore, the adhesion strength of the molded body 140 to the first lead 110 and the second lead 120 is insufficient.

Figure 3A:
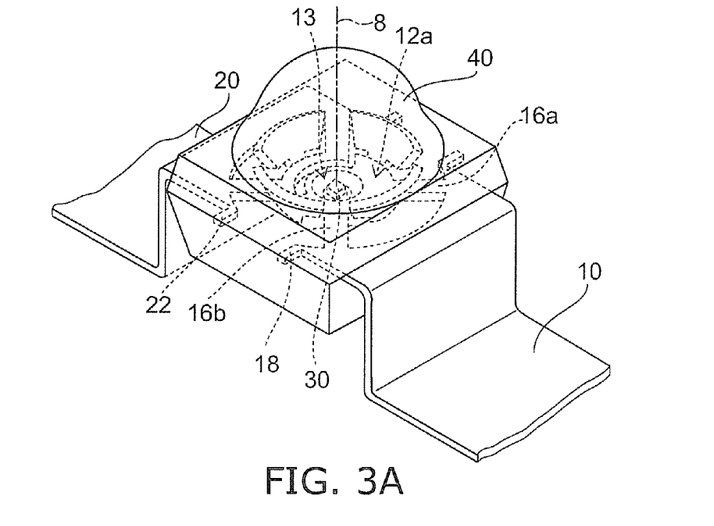
FIG. 3A is a schematic perspective view of a light emitting device according to a second embodiment.
Figure 3B:
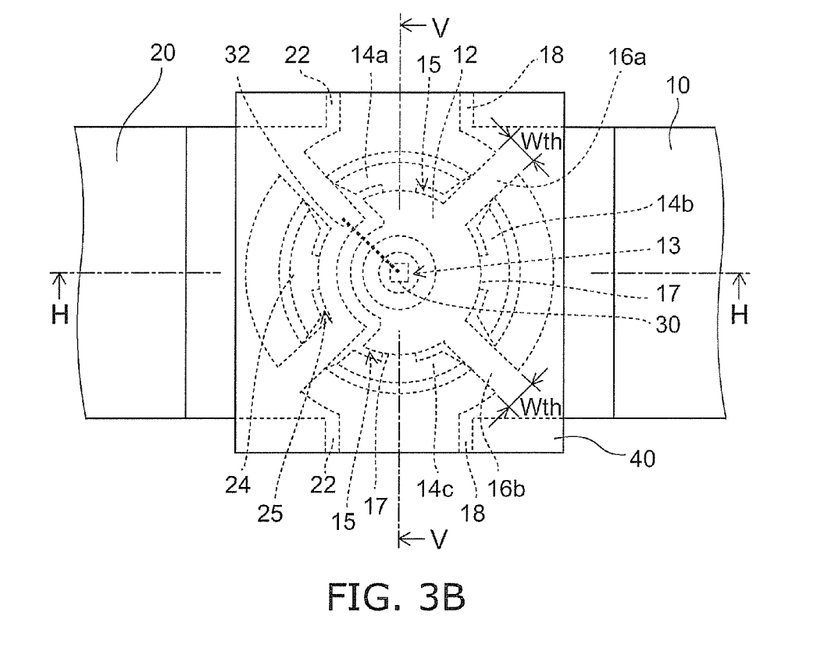
FIG. 3B is a schematic plan view thereof.

FIG. 3A is a schematic perspective view of a light emitting device according to a second embodiment of the invention, and FIG. 3B is a schematic plan view thereof.

The light emitting device includes a first lead 10, a second lead 20, a light emitting element 30, and a molded body 40 made of a transparent resin. The first lead 10 and the second lead 20 extend parallel to line H-H. Suspension pins 18, 22 extend parallel to line V-V orthogonal to line H-H.

The first lead 10 includes a die pad portion 12 having a major surface 12a provided with a recess 13, three bent portions 14a, 14b, 14c bent upward, and a thermally conductive portion 16 connected to the die pad portion 12. The thermally conductive portion 16 includes a first and second thermally conductive portions 16a, 16b having the same width. The first and second thermally conductive portions 16a, 16b sandwich the third bent portion 14b while extending radially outward from the die pad portion 12, and are each connected to the other end portion of the first lead 10. Slits 15 are cut respectively at both ends of the fold 17 bordering between the bent portion 14 and the major surface 12a.

The recess 13 is provided in the major surface 12a of the die pad portion 12. The recess 13 has a bottom surface 13a and an inclined side surface 13b. To the bottom surface 13a, the light emitting element 30 is bonded with an adhesive or solder material.

Between the bent portions 14a and 14b and between the bent portions 14b and 14c, the two thermally conductive portions 16a, 16b extend radially from the die pad portion 12.

In this embodiment, the thermally conductive portions 16 are arranged so as to intersect with line H-H at e.g. 45 degrees. Heat generated in the light emitting element 30 passes through the thermally conductive portions 16a, 16b and the other end portion of the first lead 10 and is dissipated outside.

The second lead 20 may not include bent portions. However, in FIGS. 3A and 3B, the second lead 20 includes one bent portion 24. The bent portion 24 is provided with slits 25 from both ends of the fold 17. Furthermore, the two corner portions of the bent portion 24 reduce light leakage in cooperation with the corner portion of the bent portion 14a and the corner portion of the bent portion 14c, respectively. The second lead 20 is connected to one of the electrodes of the light emitting element 30 by a bonding wire.

The molded body 40 made of a transparent resin covers the light emitting element 30, the bent portions 14, 24, the die pad portion 12, and the thermally conductive portion 16, and penetrates through the slits 15, 25 and the through hole formed in the lead frame after the bent portions 14, 24 are formed by bending sector regions.

Figure 4A:
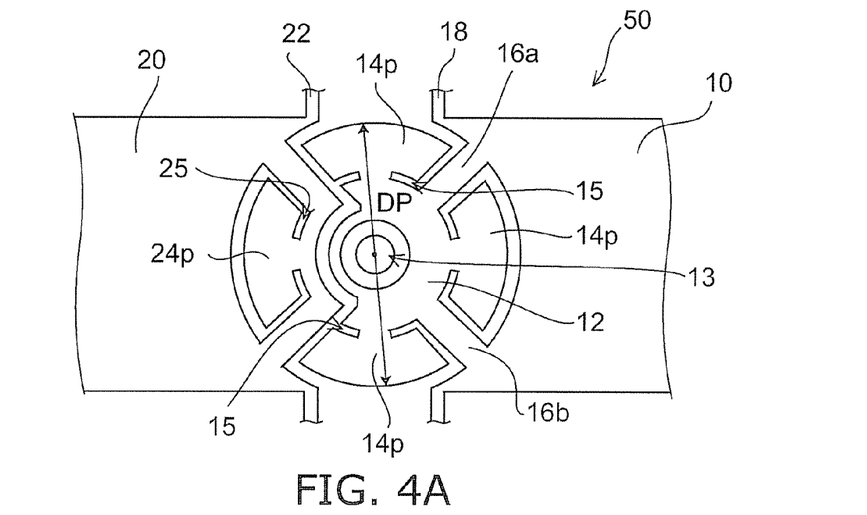
FIG. 4A is a schematic plan view of a lead frame.
Figure 4B:
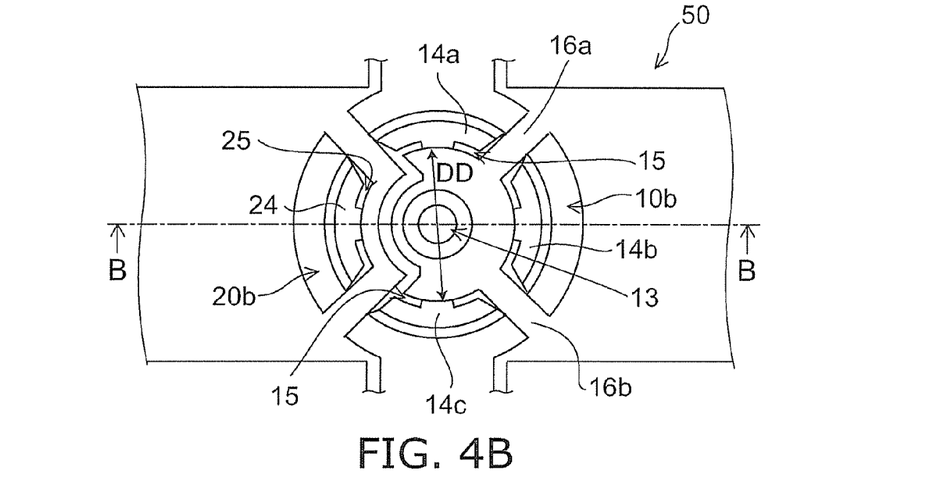
FIG. 4B is a schematic plan view of the lead frame after the bending process.
Figure 4C:
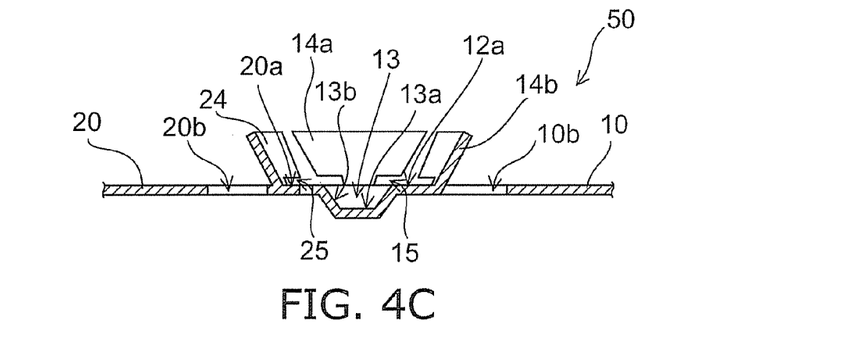
FIG. 4C is a schematic sectional view taken along line B-B.

FIG. 4A is a schematic plan view of a lead frame including a recess. FIG. 4B is a schematic plan view of the lead frame after the bending process. FIG. 4C is a schematic sectional view taken along line B-B.

The lead frame 50 is made of e.g. a copper-based alloy, and has a thickness in the range of e.g. 0.15-0.35 mm. However, the lead frame 50 is not limited thereto.

The lead frame 50 is formed by press working. The surface can be plated with e.g. silver to increase the light reflectance. As shown in FIG. 4A, a cup-shaped recess 13 is first formed by depressing. The diameter of the bottom surface 13a of the recess 13 is e.g. 0.65 mm. Furthermore, sector regions 14p, 24p formed by dividing a circle having a diameter DP of 4-4.8 mm are bent to the opposite side from the recess 13 to form bent portions 14, 24. The major surface 12a of the die pad portion 12 is made flush with the major surface 20a of the second lead 20, and the diameter DD of the fold 17 is set to 2.5 mm or more. This can ensure the space for supporting the shaping tool for fixing the neighborhood of the recess 13. After bending, a through hole 10b and a notch are formed in the first lead 10, and a through hole 20b is formed in the second lead 20. Here, the shape of the recess 13 and the die pad portion 12 is not limited to a circle, but can be an ellipse or polygon.

The bending angle can be set in the range of 45-70 degrees, and the height of the bent portions 14, 24 can be set in the range of 0.6-1.0 mm. The width of the slit, the width of the lead, the width of the suspension pin, and the width of the notch are set equal to or more than the thickness of the lead frame. This facilitates ensuring the quality of press working.

By the working such as depressing and bending, the thickness of the first lead 10 may be partly changed from the thickness of the lead frame 50 before the working. However, it is assumed that the thickness of the first lead 10 is represented by the thickness of the lead frame 50.

Figure 5A:
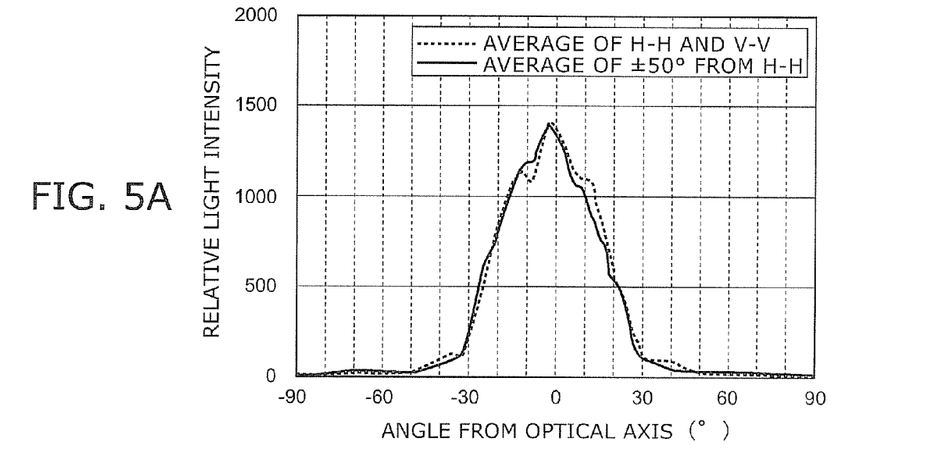
FIG. 5A is a graph of light distribution characteristics.
Figure 5B:
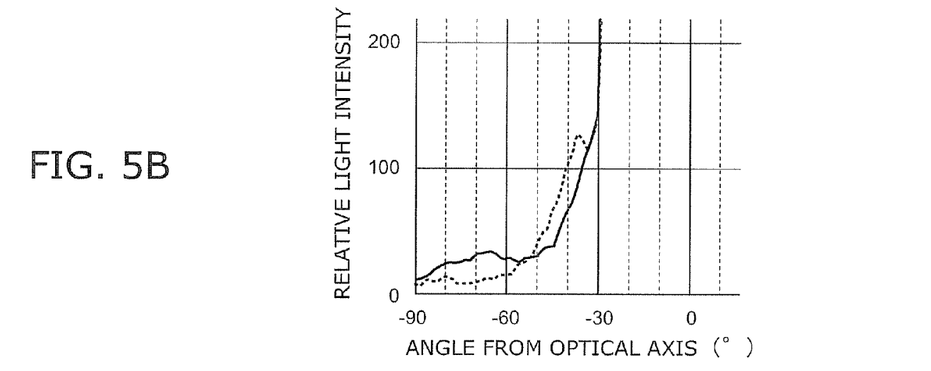
FIG. 5B is a partially enlarged graph.
Figure 5C:
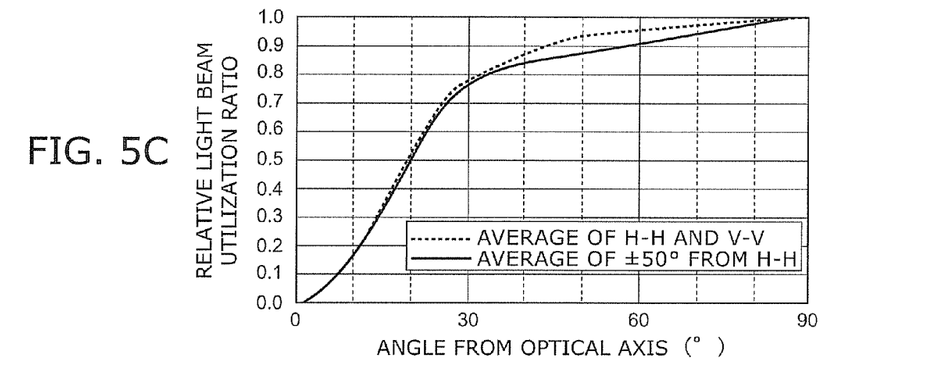
FIG. 5C is a graph of light beam utilization ratio.

FIG. 5A is a graph of light distribution characteristics, FIG. 5B is a partially enlarged graph thereof, and FIG. 5C is a graph of light beam utilization ratio with respect to angle. These characteristics are results obtained by optical simulation.

Here, the thermally conductive portions 16a, 16b are inclined +45 degrees and −45 degrees from line H-H, and each have a width Wth of 0.6 mm and a thickness of 0.25 mm. The bending angle of the bent portions 14, 24 is 60°. The height of the bent portions 14, 24 is 1.0 mm. The four side surfaces of the light emitting element 30 are orthogonal to line H-H or line V-V.

In FIG. 5A, the vertical axis represents relative light intensity, and the horizontal axis represents the angle (°) from the optical axis. The average of the light distribution characteristic along line H-H and the light distribution characteristic along line V-V is shown by the dashed line. The average of the light distribution characteristic along the line rotated clockwise by 50 degrees from line H-H and the light distribution characteristic along the line rotated counterclockwise by 50 degrees from line H-H is shown by the solid line. The neighborhood of +50 degrees and −50 degrees is the neighborhood of the gap between the bent portions. Thus, light leakage increases therein. That is, in FIGS. 5A and 5B, the relative light intensity shown by the dashed line is higher than the average shown by the solid line at angles ranging from −55 degrees to −35 degrees and ranging from +35 degrees to +55 degrees. On the other hand, the relative light intensity shown by the dashed line is lower than the average shown by the solid line at angles ranging from −86 degrees to −55 degrees and ranging from +55 degrees to +86 degrees (the light leakage can be reduced).

In FIG. 5C, the vertical axis represents relative light beam utilization ratio, and the horizontal axis represents angle (°).

The effective irradiation range can be the angular range within 45 degrees from the optical axis 8. In this case, on the average shown by the solid line, the light beam (flux) utilization ratio is generally 0.84. However, on the average shown by the dashed line, the light beam utilization ratio is generally 0.9. Thus, the light beam utilization ratio can be increased by 0.06. That is, by the bent portions, the light having a large angle from the optical axis can be reflected upward to increase the optical output in the effective irradiation range.

In the configuration of an actual illumination device, it may be desired that the amount of light leakage in a prescribed direction be reduced to within a specified value. This can be achieved by directing the line H-H or line V-V to the prescribed direction. For instance, in an illumination device with a plurality of light emitting devices arranged in two dimensions, the light emitting device of this embodiment can be arranged in the direction parallel or orthogonal to the orthogonal axes of the circuit substrate. Thus, device mounting is easier than aligning devices at a prescribed angle.

Figure 6:
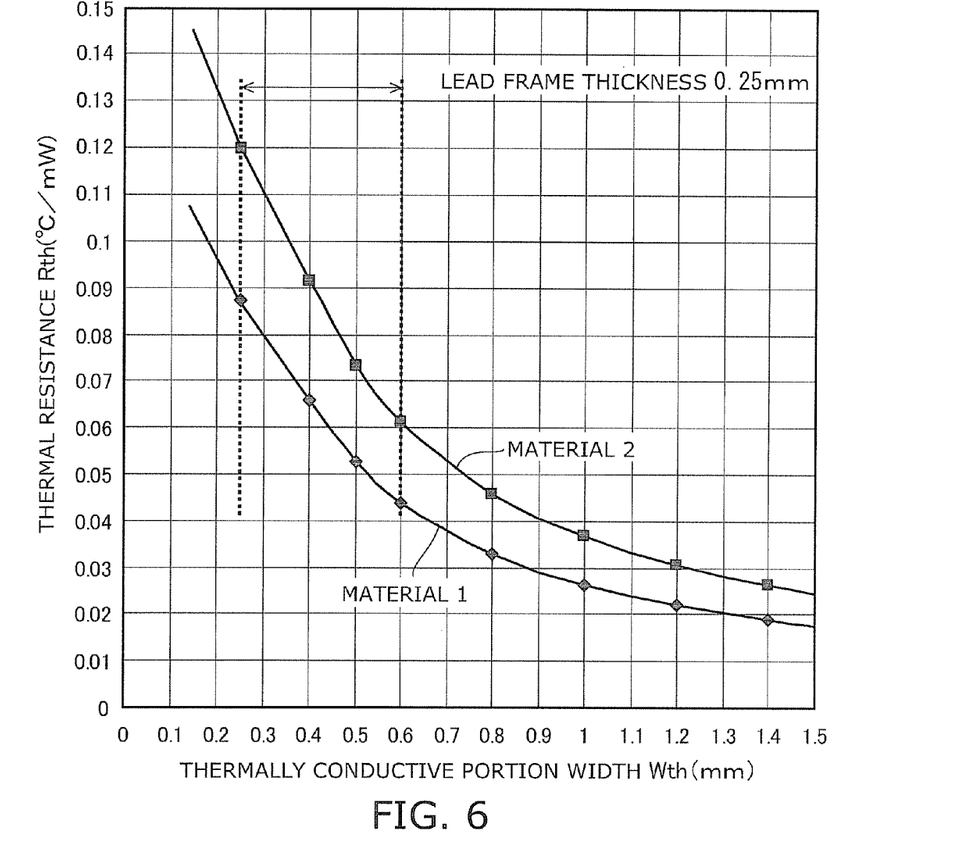
FIG. 6 is a graph showing the simulation result of the dependence of thermal resistance on the width of the thermally conductive portion.

FIG. 6 is a graph showing the simulation result of the dependence of thermal resistance on the width of the thermally conductive portion.

The vertical axis represents thermal resistance Rth (° C./mW), and the horizontal axis represents the width Wth (mm) of the thermally conductive portion. Here, the thickness of the lead frame is set to 0.25 mm to increase the strength and heat dissipation of the lead frame. The thermal resistance Rth decreases with the increase of the width Wth of the thermally conductive portion 16. However, if the width Wth is larger than 0.6 mm, light leakage from the gap between the bent portions increases. The inventors' optical simulation has revealed that if the angle subtending the thermally conductive portion 16 is 28 degrees or more in the case of the diameter DD of 2.5 mm, the light utilization ratio in the direction intersecting at ±50° from line H-H in the effective irradiation region is lower than the dashed line of FIG. 5C. That is, the width Wth of the thermally conductive portion 16 is preferably in the range of 0.25 mm or more and 0.6 mm or less (between the dotted lines).

Figure 7:
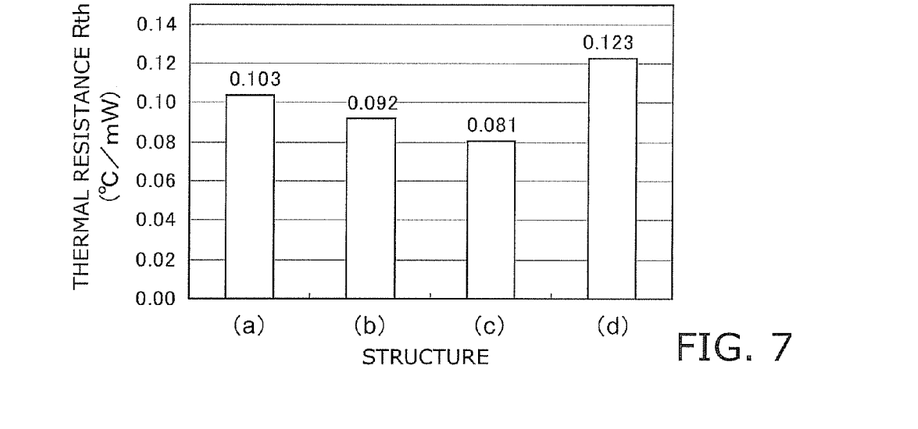
FIG. 7 is a graph of the dependence of thermal resistance on the lead frame structure.

FIG. 7 is a graph showing the simulation result of the dependence of thermal resistance Rth on the lead frame structure. Here, the thickness of the lead frame is set to 0.25 mm.

In the structures (a) to (c), the material of the lead frame is a Cu-based alloy (Fe: 0.1 wt %, P: 0.03 wt %) having a thermal conductivity of 364 W/(m·K). In the structure (a) in which the width Wth of the thermally conductive portion 16 is 0.4 mm, the thermal resistance Rth is 0.103° C./mW. In the structure (b) in which the width Wth is 0.6 mm, the thermal resistance Rth can be reduced to 0.092° C./mW. Furthermore, in the structure (c) including two thermally conductive portions 16 having a width Wth of 0.6 mm, the thermal resistance Rth can be further reduced to 0.081° C./mW. On the other hand, in the structure (d) of the comparative example of FIGS. 2A and 2B, the thermally conductive portion 16 is made of a Cu-based alloy (Fe: 2.4 wt %, P: 0.03 wt %, Zn: 0.12 wt %) having a thermal conductivity of 262 W/(m·K), and Wth is 0.4 mm. In the structure (d), the thermal resistance Rth is as high as 0.123° C./mW. Thus, the thermal resistance Rth of the light emitting device using the lead frame of the structure (c) can be reduced to generally 65% of the thermal resistance Rth of the light emitting device of the structure (d).

That is, in the second embodiment, the thickness of the lead frame is set to 0.25 mm, and the width of each of the two thermally conductive portions 16 intersecting at generally 45 degrees with the extending direction of the first lead 10 is set to 0.6 mm. Then, the thermal resistance Rth is reduced, and stable and high optical output can be achieved. Here, the two thermally conductive portions 16 may be different in width. However, if the width is equal, heat can be dissipated in a balanced manner.

Figure 8:
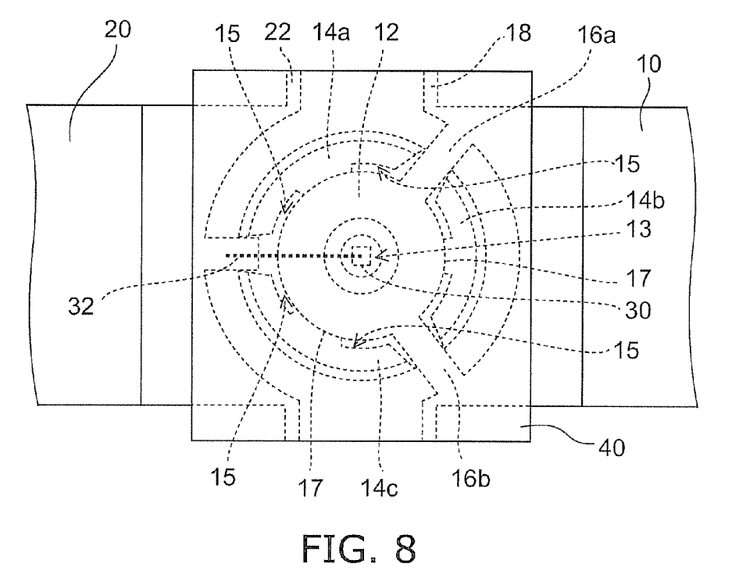
FIG. 8 is a schematic plan view of a first variation of the second embodiment.

FIG. 8 is a schematic plan view of a light emitting device according to a first variation of the second embodiment.

The first lead 10 includes bent portions 14a, 14b, 14c. A thermally conductive portion 16a extends from between the bent portions 14a, 14b, and a thermally conductive portion 16b extends from between the bent portions 14b, 14c. The thermally conductive portions 16a, 16b extend radially from these bent portions and are connected at the other end portion of the first lead 10. The end portion of the second lead 20 is sandwiched between the bent portions 14a, 14c of the first lead 10, and connected to the electrode on the upper surface of the light emitting element 30 by a bonding wire 32. The bent portions 14a, 14b, 14c form three gaps, one gap fewer than in the light emitting device of FIGS. 1A to 1C. By this amount, the light leakage can be reduced. Furthermore, the bent portions 14 divide the die pad portion 12 into three parts. For instance, the opening angle per one part is 100 degrees or more. Even for such a wide angle, the slits 15 cut from both ends of the fold 17 facilitate forming the curved surface of the bent portion 14 in a desired shape. Thus, the emission light can be efficiently reflected upward.

Figure 9:
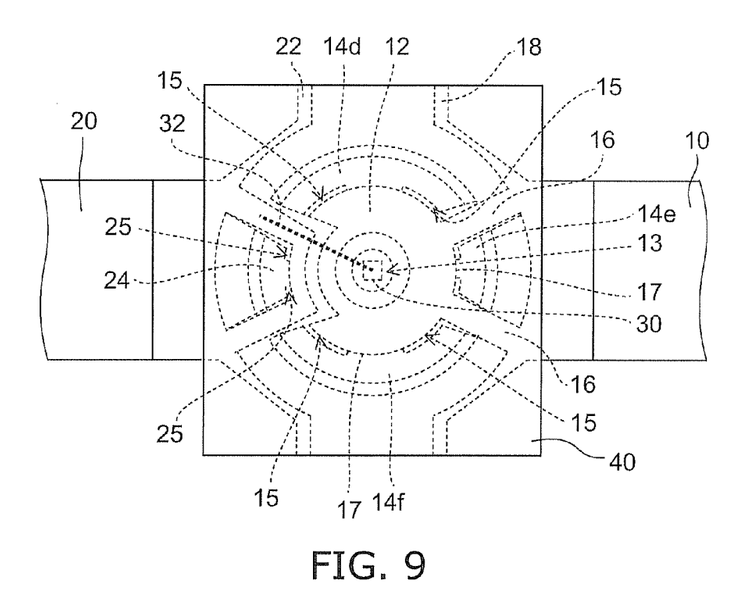
FIG. 9 is a schematic plan view of a second variation of the second embodiment.

FIG. 9 is a schematic plan view of a second variation of the second embodiment.

In the second variation, the first lead 10 includes two bent portions 14d, 14f having the same size and opposed to each other, and a bent portion 14e sandwiched therebetween and being smaller than them. The second lead 20 includes a bent portion 24 opposed to the bent portion 14e of the first lead 10 and having generally the same size as the bent portion 14e. This configuration can ensure connection even in the case where the width of each of the other end portion of the first lead 10 and the other end portion of the second lead 20 is narrowed to provide a narrow wiring region on the circuit substrate.

Figure 10A:
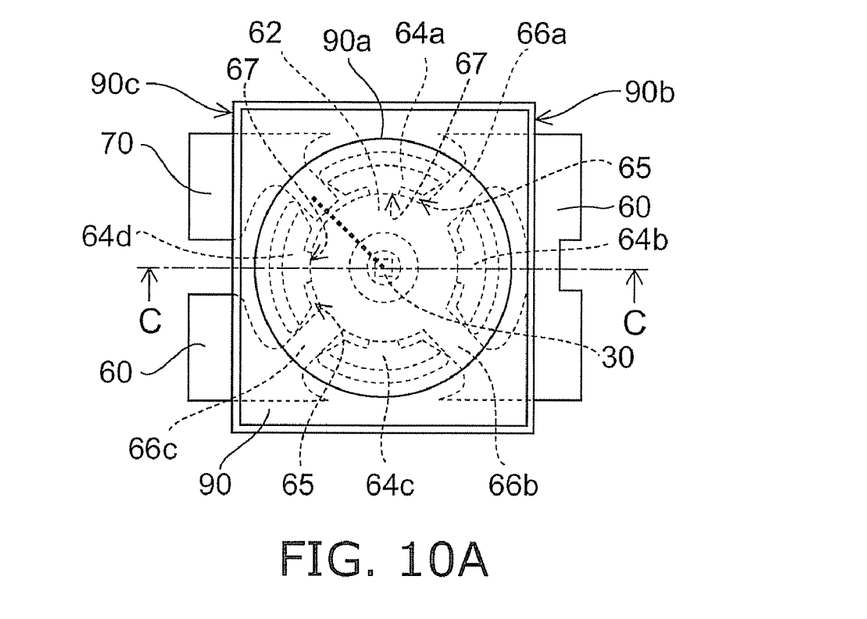
FIG. 10A is a schematic plan view of a light emitting device according to a third embodiment.
Figure 10B:
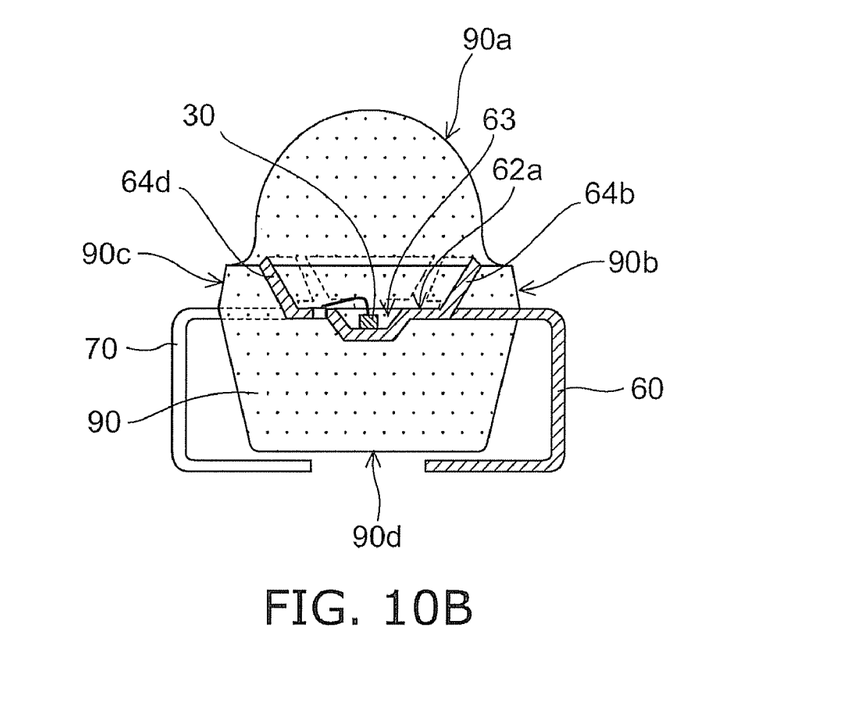
FIG. 10B is a schematic sectional view taken along line C-C.

FIG. 10A is a schematic plan view of a light emitting device according to a third embodiment, and FIG. 10B is a schematic sectional view taken along line C-C.

The light emitting device includes a first lead 60, a light emitting element 30 provided on the first lead 60, a second lead 70 with one end portion opposed to one end portion of the first lead 60, and a molded body 90 made of a transparent resin.

The first lead 60 includes a die pad portion 62 having a major surface 62a provided with a recess 63, a bent portion 64 bent toward above the major surface 62a of the die pad portion 62, and a thermally conductive portion 66 extending outward from the die pad portion 62.

The recess 63 is provided below the die pad portion 62 and has a bottom surface and an inclined side surface. To the bottom surface 63a, the light emitting element 30 is bonded with an adhesive or solder material.

The first lead 60 includes four bent portions 64a, 64b, 64c, 64d.

The molded body 90 has a first side surface 90b and a second side surface 90c provided on the opposite side from the first side surface 90b.

Slits 65 are cut respectively at both ends of the fold 67 bordering between the bent portion 64 and the major surface 62a of the die pad portion 62. The molded body 90 made of a transparent resin covers the light emitting element 30, three bent portions 64a, 64b, 64c, the die pad portion 62, and the thermally conductive portions 66a, 66b, 66c, and penetrates through the gap of the slits 65 and the through hole formed in the lead frame after the bent portions 64 are formed by bending sector regions.

The other end portion of the first lead 60 is branched, and the branched parts are each projected from the first side surface 90b and the second side surface 90c and bent downward. The other end portion of the second lead 70 is projected from the second side surface 90c and bent downward. The bent portions 64 are opposed to each other along the direction parallel to line C-C and the direction orthogonal to line C-C. However, the layout is not limited thereto. The thermally conductive portion 66a is provided between the bent portions 64a and 64b. The thermally conductive portion 66b is provided between the bent portions 64b and 64c. The thermally conductive portion 66c is provided between the bent portions 64c and 64d. Here, the three thermally conductive portions are arranged at 45 degrees, 135 degrees, and 315 degrees with respect to line C-C. However, the arrangement is not limited thereto.

Heat generated in the light emitting element 30 passes through the thermally conductive portions 66a, 66b and is dissipated outside from the first side surface 90b, or passes through the thermally conductive portion 66c and is dissipated outside from the second side surface 90c. That is, both side surfaces 90b, 90c of the molded body 90 serve as a heat dissipation path. Hence, the thermal resistance can be reduced. Here, the thermal resistance can be further reduced by widening the width of the first lead 60.

The first lead 60 and the second lead 70 bent downward may be bent toward the bottom surface 90d of the molded body 90, or bent outward in a gull-wing shape. The tip portion of the first lead 60 can be branched with bilateral symmetry. This can provide a four-pin package, which can be attached to a circuit substrate in a balanced manner.

In the first to third embodiments and the variations associated therewith, the output power of the light emitting device is readily increased by the recess provided in the die pad portion and by the bent portion. Here, the slit provided therein facilitates forming the bent portion in a curved surface as desired. Furthermore, the bent portion and the slit improve the adhesion strength between the lead frame and the sealing resin. This facilitates maintaining stable electrical and optical characteristics. Such a light emitting device is widely applicable to vehicle-mounted exterior lights and traffic lights.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A light emitting device comprising:
   a first lead including a die pad portion having a major surface and a recess provided in the major surface, a bent portion bent toward above the major surface, and a thermally conductive portion extending outward from the die pad portion, the first lead being provided with a slit at an end of a fold between the bent portion and the major surface;
   a light emitting element bonded to a bottom surface of the recess;
   a second lead with one end portion opposed to one end portion of the first lead; and
   a molded body covering the light emitting element, the bent portion, the die pad portion, the thermally conductive portion, and the one end portion of the second lead, penetrating through the slit, and made of a resin, another end portion of the first lead and another end portion of the second lead being projected from the molded body.

2. The device according to claim 1, wherein the bent portion includes a first bent portion and a second bent portion.

3. The device according to claim 2, wherein the thermally conductive portion is provided between the first bent portion and the second bent portion.

4. The device according to claim 3, wherein
   the second lead includes another bent portion bent toward above a major surface of the second lead, and
   a slit of the second lead is provided at an end of a fold between the another bent portion of the second lead and the major surface of the second lead.

5. The device according to claim 4, wherein the another bent portion of the second lead includes a first bent portion and a second bent portion.

6. The device according to claim 1, wherein the slit has a width equal to or more than a thickness of the first lead.

7. The device according to claim 3, wherein
   the first lead has a thickness of 0.25 mm or more, and
   the thermally conductive portion has a width equal to or more than the thickness of the first lead, and equal to or less than 0.6 mm.

8. A light emitting device comprising:
   a first lead including a die pad portion having a major surface and a recess provided in the major surface, a first to third bent portions bent toward above the major surface, and a first and second thermally conductive portions extending outward from the die pad portion, the first thermally conductive portion being provided between the first bent portion and the second bent portion, the second thermally conductive portion being provided between the second bent portion and the third bent portion, and the first lead being provided with slits at ends of respective folds between the first to third bent portions and the major surface;
   a light emitting element bonded to a bottom surface of the recess;
   a second lead with one end portion opposed to one end portion of the first lead; and
   a molded body covering the light emitting element, the first to third bent portion, the die pad portion, the first and second thermally conductive portions, and the one end portion of the second lead, penetrating through the slits, and made of a resin, another end portion of the first lead and another end portion of the second lead being projected from the molded body, the first and second thermally conductive portions being connected to the another end portion of the first lead.

9. The device according to claim 8, wherein the first to third bent portions have an identical size.

10. The device according to claim 9, wherein the one end portion of the second lead is sandwiched between the first bent portion and the second bent portion.

11. The device according to claim 8, wherein
the second lead includes another bent portion bent toward above a major surface of the second lead, and
a slit of the second lead is provided at an end of a fold between the another bent portion of the second lead and the major surface of the second lead.

12. The device according to claim 11, wherein the bent portion of the second lead is opposed to the second bent portion of the first lead.

13. The device according to claim 12, wherein the first to third bent portions of the first lead and the bent portion of the second lead have an identical size.

14. The device according to claim 12, wherein
the first bent portion and the third bent portion have an identical size and are opposed to each other,
the second bent portion and the bent portion of the second lead have an identical size and are opposed to each other, and
the first bent portion is larger than the second bent portion.

15. The device according to claim 8, wherein the slits have a width equal to or more than a thickness of the first lead.

16. The device according to claim 8, wherein
the first lead has a thickness of 0.25 mm or more, and
the first and second thermally conductive portions have a width equal to or more than the thickness of the first lead, and equal to or less than 0.6 mm.

17. A light emitting device comprising:
a first lead including a die pad portion having a major surface and a recess provided in the major surface, a first to fourth bent portions bent toward above the major surface, and a first to third thermally conductive portions extending outward from the die pad portion, the first thermally conductive portion being provided between the first bent portion and the second bent portion, the second thermally conductive portion being provided between the second bent portion and the third bent portion, the third thermally conductive portion being provided between the third bent portion and the fourth bent portion, the first lead being provided with slits at ends of respective folds between the first to fourth bent portions and the major surface;
a light emitting element bonded to a bottom surface of the recess;
a second lead with one end portion opposed to the die pad portion; and
a molded body covering the light emitting element, the first to fourth bent portions, the die pad portion, the first to third thermally conductive portions, and the one end portion of the second lead, penetrating through the slits, having a first side surface and a second side surface provided on opposite side from the first side surface, and made of a resin,
the first and second thermally conductive portions being connected, projected from the first side surface, and bent downward, and
another end portion of the second lead and an end portion of the first lead connected to the third thermally conductive portion each being projected from the second side surface and bent downward.

18. The device according to claim 17, wherein the second lead and the first lead projected from the second side surface and bent downward, and the first lead projected from the first side surface and bent downward, are further bent toward a bottom surface of the molded body, or outward from the molded body.

19. The device according to claim 17, wherein the first to fourth bent portions have an identical size.

20. The device according to claim 17, wherein the slits have a width equal to or more than a thickness of the first lead.

* * * * *